United States Patent [19]

Mayo, Jr.

[11] Patent Number: 4,789,831

[45] Date of Patent: * Dec. 6, 1988

[54] PRODUCING PSEUDOCOLOR MAGNETIC RESONANCE IMAGES

[75] Inventor: William T. Mayo, Jr., Seal Beach, Calif.

[73] Assignee: North American Philips Corporation, New York, N.Y.

[*] Notice: The portion of the term of this patent subsequent to Sep. 1, 2004 has been disclaimed.

[21] Appl. No.: 6,534

[22] Filed: Jan. 23, 1987

Related U.S. Application Data

[63] Continuation-in-part of Ser. No. 767,457, Aug. 20, 1985, Pat. No. 4,690,150.

[51] Int. Cl.⁴ .............................................. G01R 33/20
[52] U.S. Cl. ..................................... 324/309; 128/653; 358/82
[58] Field of Search ............................... 128/653, 660; 358/81–82, 110, 112; 340/703; 342/181; 324/309

[56] References Cited

U.S. PATENT DOCUMENTS 4,690,150 9/1987 Mayo, Jr. ............................ 128/660
4,694,250 9/1987 Iwaoka et al. ....................... 324/309
4,694,836 9/1987 Buikman et al. .................. 324/322 X

OTHER PUBLICATIONS

Bydder, G. et al., "Magnetic Res. Imaging of the Brain", in *Rad. Clin. of North Amer.*, vol. 22, No. 4, Dec. 1984, pp. 779–792.
Smith et al., "Color Gamut Transform Pairs", *Computer Graphics*, vol. 12, 1978.

*Primary Examiner*—Francis J. Jaworski
*Attorney, Agent, or Firm*—Jack E. Haken

[57] ABSTRACT

A method for displaying the values of two parameter at a plurality of points in an image. The intensity of each pixel in the display is modulated in accordance with the value of the first parameter at corresponding points in the image. The hue of each pixel is modulated to a first color whenever the value of the second parameter at the corresponding point in the image is greater than a reference value and to a second color whenever the value of the second parameter is less than the reference value. The saturation at each pixel is modulated as a function of the absolute value of the deviation of the second parameter from the reference value at the corresponding point in the image.

5 Claims, 9 Drawing Sheets

PRODUCING PSEUDOCOLOR MAGNETIC RESONANCE IMAGES

RELATED CASES

This is a continuation-in-part of U.S. patent application Ser. No. 767,457 filed Aug. 20, 1985 now U.S. Pat. No. 4,690,150.

The invention relates to a method and apparatus for displaying data. More particularly, the invention relates to a method and apparatus for producing an image display wherein each pixel represents the values of two independent parameters at a corresponding point in a data field image. The invention is useful for displaying a diagnostic magnetic resonance image of a human subject or animal, in which case the first parameter may be spin echo intensity and the second parameter may be relaxation time. The invention is also useful for displaying diagnostic ultrasound images when the first parameter is the amplitude of an ultrasound echo signal and the second parameter is the instantaneous frequency deviation of the echo signal.

BACKGROUND OF THE INVENTION

It is well known that pseudocolor enhances human perception of gray scales and enables an observer to quantify a single parameter image. However, it is also known that most medical radiologists do not like pseudocolor images.

Electronic Picture Archiving and Communication Systems (PACS) provide convenient mechanism for storing multicolor images. Ultrasound flow visualization systems now demonstrate the necessity for color displays when more than one independent parameter must be simultaneously displayed. It has been shown that color can allow the eye-brain combination to form useful correlations on multiparameter image data, if it can be used in a pleasing manner.

It is known that separate use of red, green and blue to image three independent variables leads to confusing images. A more natural presentation is used in commercial color television and in map making where a primary image is shown as a high (spatial) resolution intensity image and secondary parameters are visualized by color tinting (which typically has less spatial resolution than the primary image). Thus, the hue (color) and the saturation (purity of color) can be used to present two independent low-resolution variables which are superimposed on a high resolution intensity image.

FIG. 1 schematically illustrates a two-dimensional chromaticity space of hue and saturation in polar coordinates. In the figure, $S=0$ is white (zero color saturation) and the circle $S=1.0$ represents pure monochromatic colors (fully saturated). In this model, locations near $S=0$ are pastel colors.

In the prior art, three parameters of position in an image (such as $a(x,y)$, $f(x,y)$ and $g(x,y)$) were respectively assigned to Intensity, Hue and Saturation as, for example:

Intensity: $I(x,y) = K_i\, a(x,y)$ (1)

Hue: $H(x,y) = K_h\, f(x,y)$ (2)

Saturation: $S(x,y) = K_s\, g(x,y)$ (3)

where $K_i$, $K_h$, and $K_s$ were constants.

The simplest use of these relations is to set $S=0$ everywhere (which implies that the hue is irrelevant) black and white intensity images are thus produced from the function $a(x,y)$.

In the usual prior art pseudocolor display, the single parameter, $I(x,y)$ is set to a constant, $S$ is set to unity (fully saturated color), and the parameter $f(x,y)$ is imaged with hue as the only variable. Many people find such images distasteful.

In a more acceptable prior art method, "color tinting" of a gray scale image is accomplished using all three equations. If only one additional parameter is of interest, it is common to set $S$ equal to a constant and to use $H(x,y)$ as the parametric variable. Thus color tinting of a black and white image conveys low resolution information as an overlay through which the observer can see the usual image of intensity information $a(x,y)$ in the same manner as color tinted black and white photographs. If $S$ is chosen as unity, this scheme is still unsatisfying to many observers. More pleasing images have been formed if $S$ is set to a small value which leaves all colors as unsaturated pastels.

In medical ultrasound, conventional pulsed-echo instruments display a monochrome image of the envelope of the RF echo signal which is returned from the body. Isolated point scatterers and large, reflecting interfaces thus show up as points or lines. The image represents a slice which is perpendicular to a plane swept out by the ultrasound beam. The resolution cell is formed by the RF pulse length (in the axial direction) and the diffraction limited lateral focus of the transducer aperture after any propagation distortions (attributable for example to refractive index variations in the body).

Living human tissue possesses a significant frequency dependent attenuation characteristic which is normally modeled, (to a first approximation) in healthy liver tissue, as linear with a slope of approximately 0.5 db/cm/MHz. As an example, at 3 MHz, the attenuation for a "normal" human liver tissue is 1.5 db/cm in each direction or 3 db/cm for round trip pulse echoes. A 20 cm path depth thus requires a time-gain-compensation (TGC) amplifier with a 60 db gain increase over the time of the return signals after the transmit pulse. When a broadband RF pulse is transmitted, lower frequency components of the signal are attenuated less than the high frequency components. Thus, the spectral centroid (and hence the average instantaneous frequency) of the echoes shifts downward as a function of the depth of the reflector.

It has been hypothesized that diseased livers have physical structures which may scatter and attenuate ultrasound energy in different manner than healthy tissue. Numerical tissue characterization methods have attempted to measure the attenuation down-shift separately from gross tissue structures and to avoid non-homogeneous regions of tissue (such as central portions of the liver).

Data obtained from magnetic resonance imaging (MRI) systems contains a wealth of information which is often difficult to integrate for diagnostic purposes. For example, spin echo intensity (SE) is a good parameter for imaging structural detail in the brain while the T2 relaxation time can be useful for visualizing some brain tumors.

SUMMARY OF THE INVENTION

In accordance with the invention, a combination of hue and saturation coding is used to overlay a secondary parameter display on an intensity modulated display of a primary parameter. The method provides a pleasing and useful color mapping which is particularly useful to display relaxation time information on a magnetic resonance spin echo image or frequency shift information in conjunction with a display of the intensity of reflected ultrasound pulses. The method can also be used, for example, to overlay parametric information such as temperature or elevation in other views such as aerial photographs or primary radar images.

In accordance with the present invention, a second parameter f(x,y) is used to tint an intensity image I(x,y) = a(x,y) with a combination of hue and saturation parameters so that the hue is determined by the sign of the deviation of the value of the second paramete from a reference value, $f_0$, and the saturation is proportional to the absolute value of that deviation For example:
when $f(x,y) < f_0$: H(x,y) = Blue $$S(x,y) = C_1 \frac{f_0 - f(x,y)}{(f_0 - f_{min})}$$

and when $f(x,y) > f_0$: H(x,y) = Red $$S(x,y) = C_1 \frac{f(x,y) - f_0}{(f_{max} - f_0)}$$

where $C_1$, $f_{max}$, $f_{min}$, and $f_0$ are constants. Thus, as f increases from its minimum to its maximum, the chromaticity follows a path, as illustrated in FIG. 1, from a relatively saturated blue through the pastel shades of blue through white and then through a pastel and into a relatively saturated red color. Any radial path inward from a saturated color to white and out again along another radial path to some contrastng color may be used. FIG. 1 illustrates a path from blue through red. In a preferred embodiment, the path begins and ends at somewhat unsaturated pastel colors as this seems to provide a more pleasing image.

The principle features of the image are:
(1) when there is no deviation of the secondary parameter from its reference or equilibrium value, then the image is black and white without color tint; and
(2) color deviations have a linear (one dimensional) directional sense (for example: from blue to red) which may be associated mentally as left-right, up-down, hot-cold, good-bad, big-little, etc. instead of the sometimes disorienting "circular loop" which occurs when hue modulation alone is used.

DESCRIPTION OF THE DRAWINGS

The invention may be understood with reference to the attached drawings in which:

FIG. 10 is a flow chart of an HSI to RFG transformation.

DESCRIPTION OF THE PREFERRED EMBODIMENT

Figure 2:
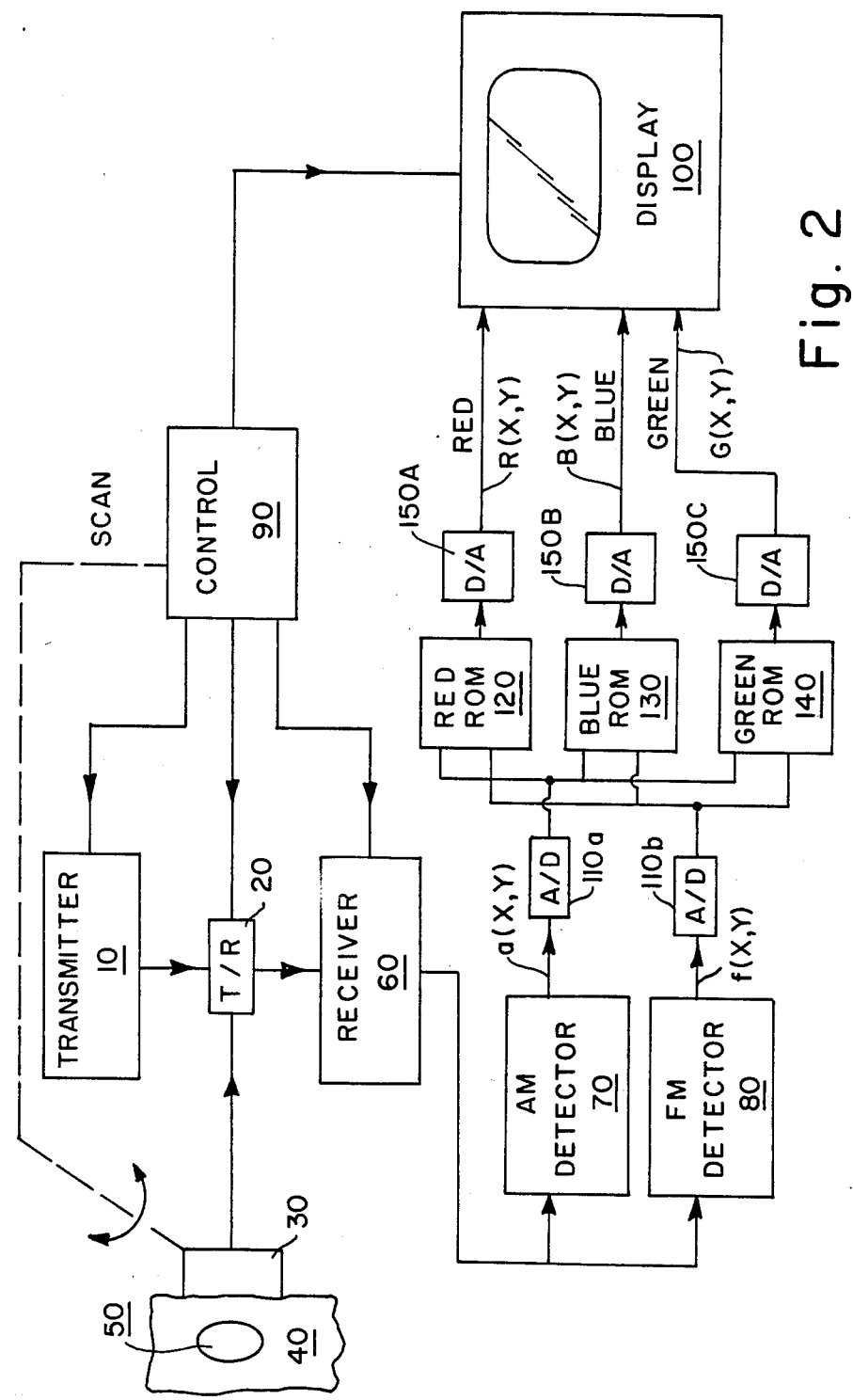
FIG. 2 is an echo ultrasound system which illustrates principles of the invention.

FIG. 2 is a block diagram of an echo ultrasound imaging system which illustrates principles of the invention. A transmitter 10 generates radio frequency electrical pulses ich are directed via a T-R switch 20 to an ultrasound transducer 30. The transducer converts the electrical pulses into pulses of ultrasound energy which are directed into a body undergoing examination 40. Portions of the ultrasound energy emitted from the transducer 30 are reflected from structures in the body (indicated schematically as 50) and are returned as echoes to the transducer 30. The transducer converts the echoes into electrical echo signals which are transmitted via the T-R switch 20 to a receiver 60 where they undergo amplification and signal processing in a conventional manner. The output signals from the receiver are conveyed to an AM detector 70 and to an FM detector 80. The AM detector may be of the conventional type utilized in prior art pulse-echo ultrasound systems and may include time gain compensation (TGC) circuitry. The transmitter 10 and receiver 60 operate under the influence of signals from control circuits 90. The control circuits also causes the beam of ultrasound from.the transducer 30 to oscillate in a plane to generate a conventional sector scan of the body. In a preferred embodiment the transducer may be motor driven to steer the ultrasound beam. Alternately, stepped or phased array techniques may be utilized to steer the beam. A sweep signal from the control circuitry 90 is connected to a color display unit 100, which may be an RGB CRT display. In a conventional manner, the sweep signal from the control circuitry 90 scans the electron beam on the face of the CRT so that its instantaneous position maps pixels on the face of the tube which correspond to the points in the body from the corresponding echo signals (which produce the outputs from the AM detector 70 and the FM detector 80) originate.

The output signals, a(x,y) from the AM detector 70 and f(x,y) from the FM detector 80, are digitized, respectively, in A to D converters 110a and 110b. The outputs from the A to D converters 110a and 110b are fed to the address inputs of three ROM memories 120, 130 and 140. The ROM memories 120, 130 and 140 respectively contain look-up tables which are translate the combined signals produced by the outputs of the AM detector and FM detector into intensity values which are applied, via D to A converters 150a, 150b and 150c to modulate the intensity of the red, blue and green electron guns of the color CRT.

Figure 1:
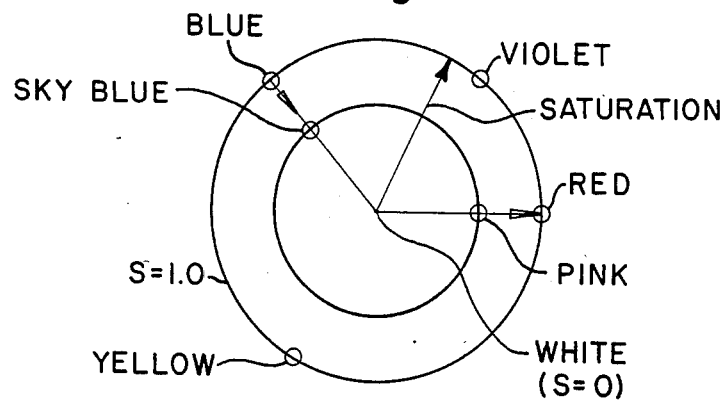
FIG. 1 is a simplified chromaticity diagram which illustrates the invention.
Figure 3A:
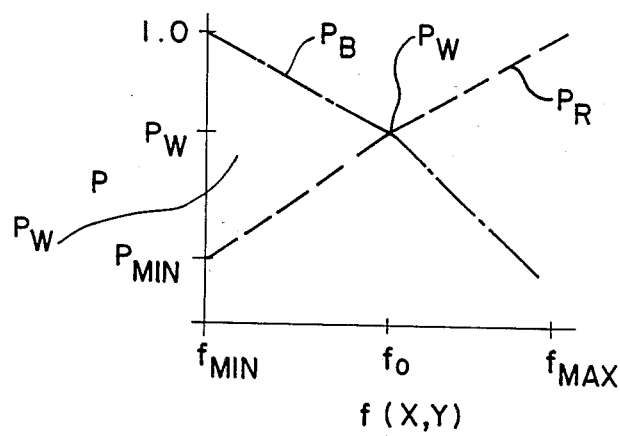
FIGS. 3a and 3b are plots of RGB multiplier values.
Figure 3B:
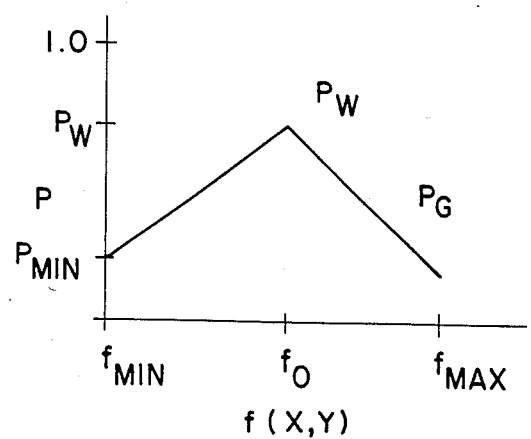

In a preferred embodiment of the invention, the look-up tables in the ROM memories 120, 130, and 140 respectively generate a red signal, R(x,y), a blue signal B(x,y), and a green signal G(x,y) in accordance with the formulas $I(x,y) = K_i\, a(x,y)$ $R(x,y) = P_R(x,y)\, I(x,y)$ $G(x,y) = P_G(x,y)\, I(x,y)$ $B(x,y) = P_B(x,y)\, I(x,y)$ where the multipliers $P_R$, $P_G$ and $P_B$ are all less then unity and are functions of f(x,y) determined according to the mapping illustrated by the straight lines in FIGS. 3a and 3b. When $P_{min}$ differs from zero, maximum saturation is not obtained. When the output of the FM detector indicates that the center frequency of the return echoes is equal to the nominal center frequency of the echo signal, $f_0$, all three color guns are balanced to produce a nominally white pixel.

It is also possible to obtain a particularly pleasing modulation scheme by varying the value of $P_W$. That is to say the value of the intensity (I=R+G+B) is in fact slightly modulated by f(x,y).

Figure 2A:
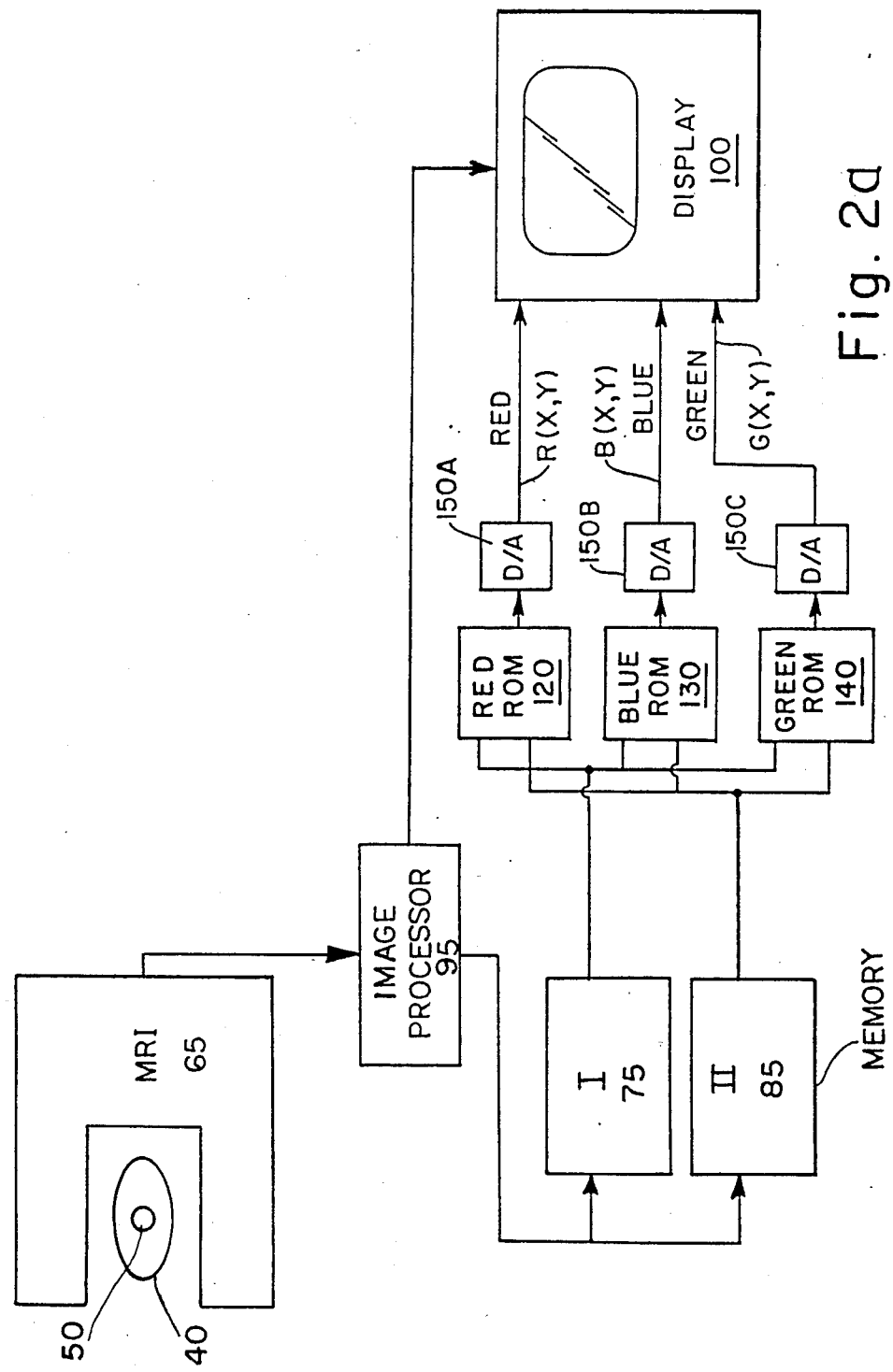
FIG. 2a is an MRI system which incorporates the invention.

FIG. 2a is an MRI imaging system which incorporates the invention. A conventional magnetic resonance imaging device 65 is operated, in a known manner, to sequentially produce three gray scale images of a region 50 in a body 40 so that each of the images emphasizes different magnetic resonance parameters of the body tissues. As an example, the first image may emphasize the local magnetic resonance spin echo intensity RHO while the second and third images may respectively emphasize the local magnetic resonance relaxation times T1 and T2. The three images are combined in an image processor 95, in a manner more specifically described below, to yield to composite images which are respectively stored in a first memory region 75 and a second memory region 85 of an image memory. Data from the memory regions 75 and 85 are applied to address red, blue and green ROMs 120, 130, and 140 which drive D/A converters 150A, 150B and 150C to produce red, blue and green signals which are inputs to an image display 100 in the manner described above.

In a preferred embodiment of the invention three MRI greyscale images were combined into a single image using subtle color coding. The images were processed to optimize resolution and dynamic range and then pairs of images were scaled and combined into a two parameter color image format. Finally, color video output lookup tables were loaded with an optimal color transform function of hue-saturation-intensity to red-green-blue. The result was an assigning of two uncorrelated greyscale images to the hue/saturation and intensity components of a two parameter color image to create a comprehensive and visually pleasing image display which contained more perceivable information than any of the original greyscale images.

Four processing steps were used to create and display the two parameter color images:

(1) greyscale image data preprocessing;
(2) greyscale image formation;
(3) color image formation; an
(4) color image displayl.

The original image data set was composed of three MRI images which were designated: RHO.MAS, a spin echo image; T1.MAS, a T1 relaxation image; and T2.MAS, a T2 relaxation image. Each image was in digital format with 8 bits/pixel and 256 rows by 256 columns of pixels/image.

Conditional averaging was used to decrease noise degradation while minimizing image smoothing. A program COND-AVG.C was used to implement conditional averaging.

For each pixel (x,y), calculate:

$$\text{average}(x,y) = [\text{pixel}(x-1,y-1) + \text{pixel}(x,y-1) \quad (1-1)$$
$$+ \text{pixel}(x+1,y-1) + \text{pixel}(x-1,y)$$
$$+ \text{pixel}(x+1,y) + \text{pixel}(x-1,y+1)$$
$$+ \text{pixel}(x,y+1) + \text{Pixel}(x+1,y+1)]/8$$

$$\text{threshold}(x,y) = \text{percent} * \text{average}(x,y) \quad (1-2)$$
$$\text{difference}(x,y) = ABS(\text{pixel}(x,y) - \text{average}(x,y)). \quad (1-3)$$
Then perform conditional average: (1-4)
If (difference(x,y) > threshold(x,y)) Then
pixel(x,y) = average(x,y)
The sensitivity of the filter is defined by the value of the variable, percent, in equation (2).

Histogram equalization was used to fully utilize the eight bit dynamic range of the imaging system. A program NORMING.C was used to implement histogram equalization.

The program searches the original image data for the maximum and minimum pixel values. The operator enters a new minimum and a new maximum pixel value.

$$\text{pixel} = (\text{pixel} - \text{minimum}) * \frac{(\text{newmax} - \text{newmin})}{\text{maximum} - \text{minimum}} + \text{newmin} \quad (2-1)$$

if (pixel>255) pixel=255 (2-2)

if (pixel<0) pixel=0 (2-3)

Magnification was performed to increase the spatial resolution of the image. A program MAG.C was used to implement third order polynomial 2-D interpolation.

Finally, histogram normalization was used to maximize the hue.saturation, and intensity dynamic range in the final color images. A program HISTNORM.C was used to implement the histogram normalization.

Figure 4A:
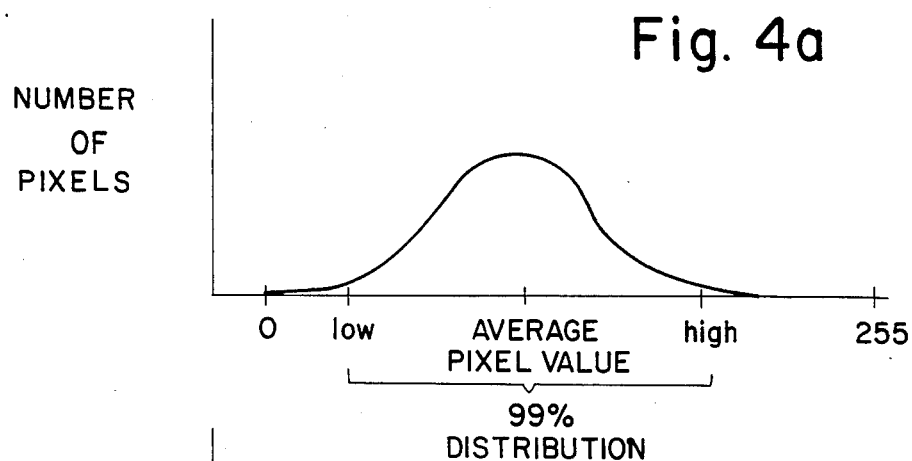
FIGS. 4 and 4b are pixel histograms.

The program calculates the image histogram and the average pixel value. The histogram distribution is then integrated symmetrically about the average pixel value until the low and high pixel values which define the bounds of a subdistribution are found. The subdistribution is defined as a percent of the total number of image pixels. FIG. 4a shows a typical result for a distribution cutoff of 99%.

Once the low and high pixel cutoff values are defined a normalization gain factor is calculated as:

if ((high-average)>(average-low))

gain=127/high else gain=127/low (3-1)

The histogram normalization is then performed according to:
For each pixel, $$\text{Pixel} = (\text{pixel-average}) * \text{gain} + 127 \quad (3-2)$$

Figure 4B:
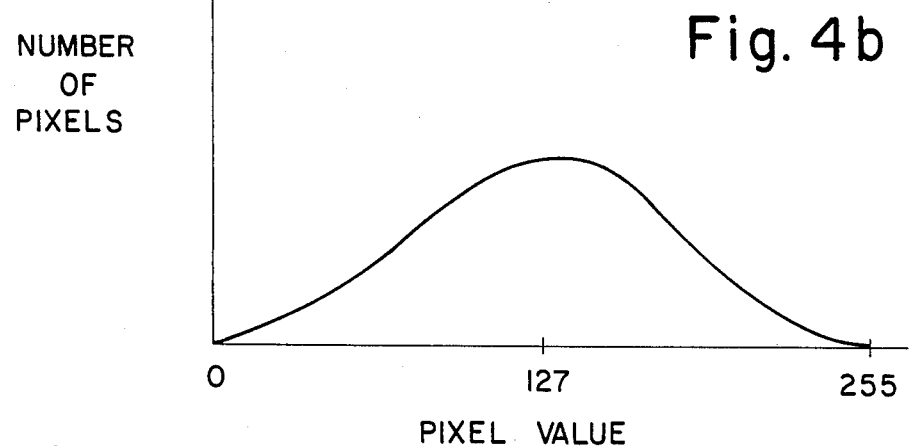

This results in a pixel histogram centered around value 127 as shown in FIG. 4b.

Figure 5C:
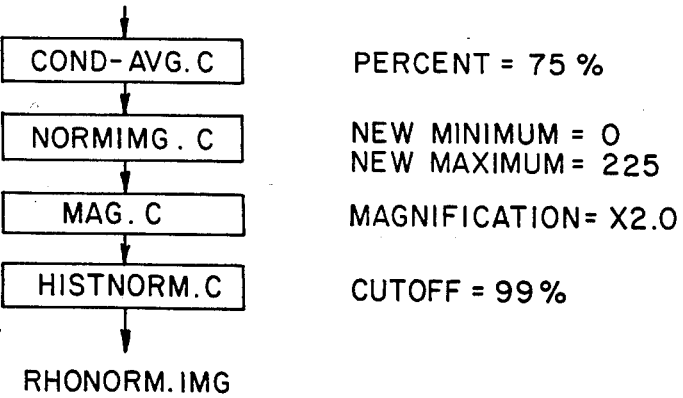
FIGS. 5a–5c are flow charts of methods for preprocessing MRI image data.
Figure 5A:
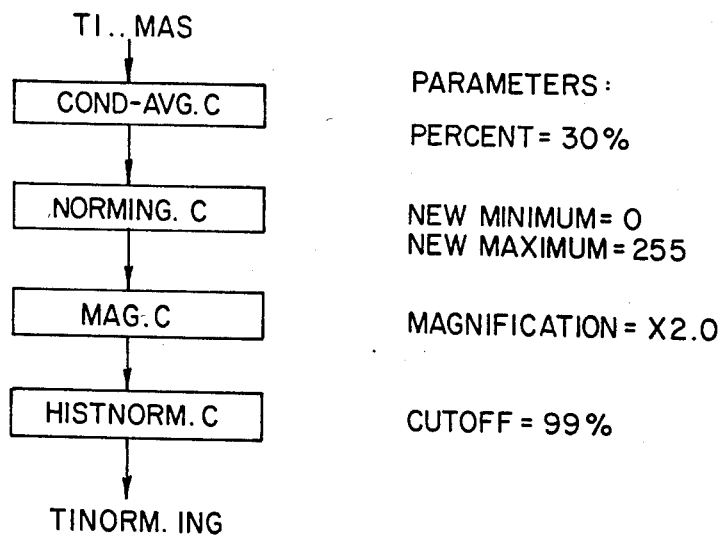
Figure 5B:
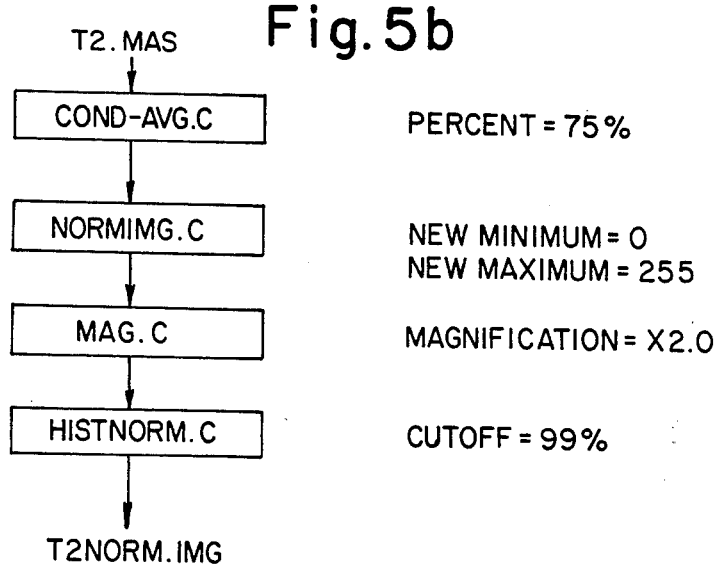

FIGS. 5a–5c summarize the preprocessing data flow and program parameters. The three images created as a result of the preprocessing were RHONORM.IMG, T1NORM.IMG, and T2NORM.ING. All three images had 512×512×8 bit resoltion.

Figure 6:
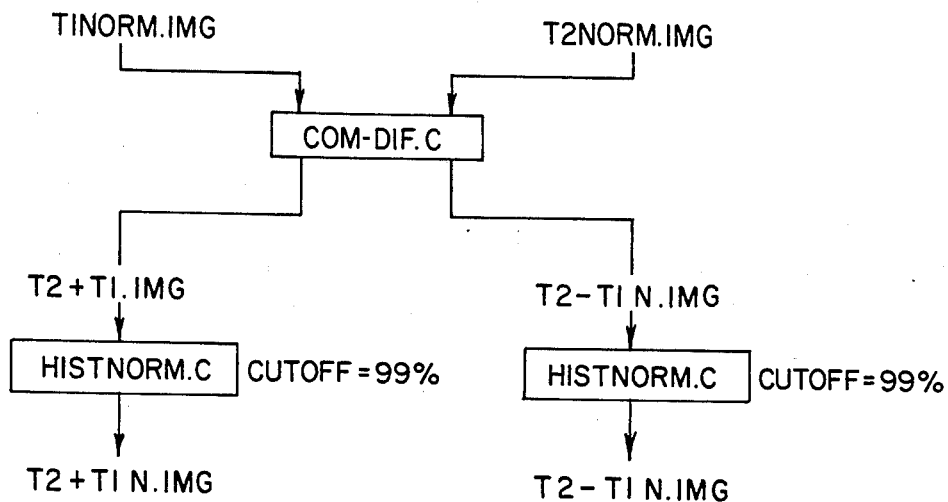
FIG. 6 is a flow chart of a method for forming a composite greyscale image from MRI relaxation time data.

In addition to using the RHO, T1 and T2 greyscale image data, new images were created to code hue/saturation and intensity components of new two parameter color images. The two new images are the average and difference of the T1 and T2 images. A program COMDIF.C created the "Common Mode" and "Differential Mode" images. FIG. 6 describes the data flow and program parameters in greyscale image formation.

Each pixel of a two parameter color image was composed of two elements: hue/saturation and intensity. In each pixel, the most significant bits were hue/saturation and the least significant were intensity. Each pixel of the two parameter color image was segmented with three hue/saturation bits and five intensity bits. This allowed eight possible hue/saturation combinations and thirty-two possible intensities, for a total of 256 different colors.

In order to create an image with the pixel format described above, two images, one describing hue/saturation and the other describing intensity, were scaled and then combined according to:

$$\text{pixel}(x,y) = \left( H/S(x,y) * \frac{2^{8-ibits} - 1}{255} * ibits + (I(x,y) * \frac{2^{ibits} - 1}{255} \right). \quad (4)$$

Where H/S(x,y) is an eight bit pixel of a hue/saturation—coding image, I(x,y) is an eight bit pixel of an intensity—coding image, ibits is the number of intensity—coding bits in the two parameter color image, and pixel (x,y) is the resulting color pixel.

Figure 7:
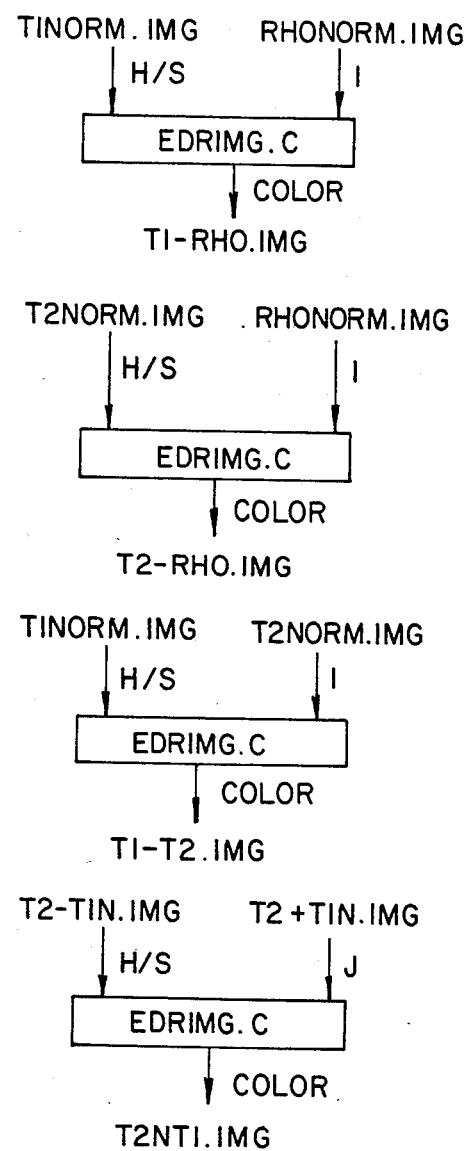
FIG. 7 illustrates formation of a color image from greyscale data.

A program EDRIMG.C implemented the creation of two-parameter color images from two greyscale images. FIG. 7 shows how EDRIMG.C was used to create four color images. The first three color images were created from the RHO, T1 and T2 preprocessed greyscale images and the fourth was created from the common mode and differential mode of the T1 and T2 preprocessed greyscale images.

Figure 8:
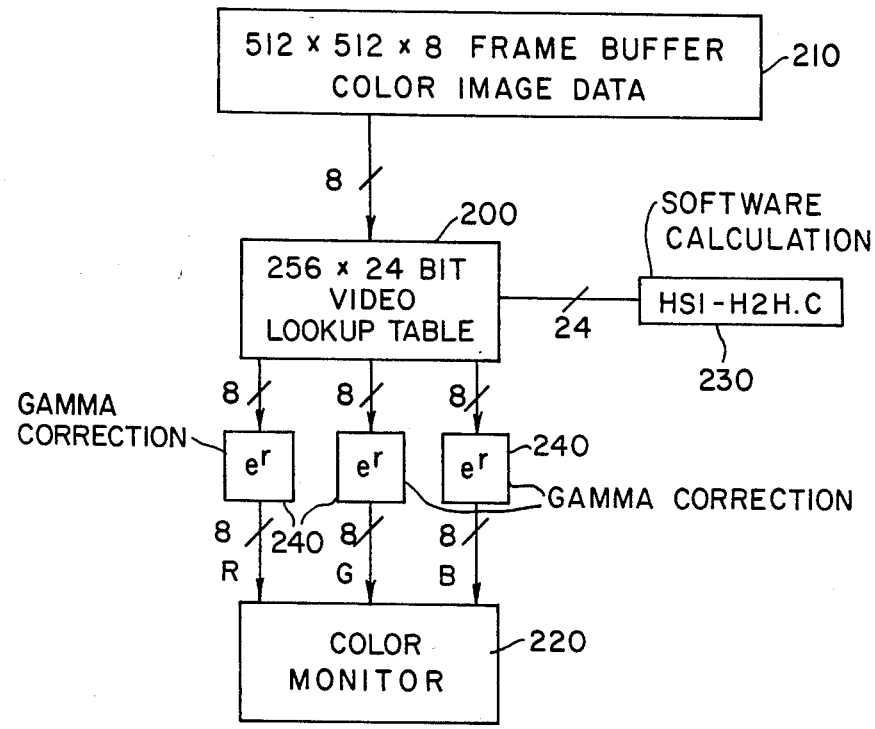
FIG. 8 is apparatus for color image display.

The last step in the formation and display of two parameter color images was the translation from hue-saturation-intensity color space to red-green-blue color space to drive a RGB color monitor 220 (FIG. 8) through gamma-correcting modules 240. This translation was performed in a 256×24 bit video output look up table 200. The images were stored in a frame buffer 210. Each eight bit pixel addresses one of the 256 look up table entries and selects corresponding 24 bit red, green, blue value composed of 8 bits red, 8 bits green, and 8 bits blue. This look up table color translation allows any 256 colors from a total of $2^{24}$=16M possible colors.

Several different color models exist to define the translation from hue, saturation, intensity color space to red, green, blue color space. The model chosen for this embodiment was the triangle model, which is explained in detail in "Color Gamut Transform Pairs," by A. R. Smith, volume 12 of *Computer Graphics*, 1978.

The triangle model defines intensity (I) as a weighted sum of red, green, and blue components of a color such as:

$$I = W_r R + W_b B + W_g G, \quad (5)$$

Where $W_r$, $W_b$, and $W_g$ are red, green, and blue weighting factors; and R, G, and B are red, green, and blue color components.

The weighting factors and color components are in the range from zero to one, and the sum of the weighting factors is one. A normalized color is defined by the components:

$$r = \frac{W_r}{I} * R, \quad (6)$$

$$g = \frac{W_g}{I} * G, \quad (7)$$

and $$b = \frac{W_b}{I} * B, \quad (8)$$

Figure 9A:
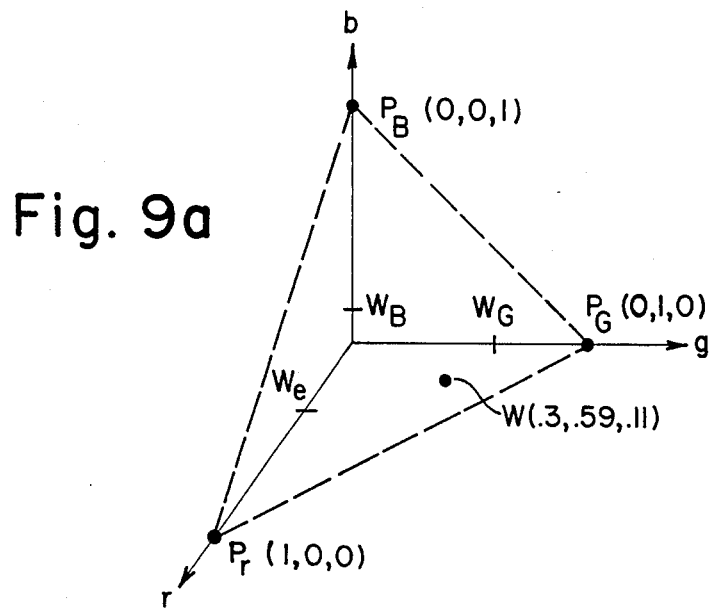
FIGS. 9a–9c illustrates a triangle color model.

All normalized colors satisfy the conditions:

$$r + g + b = 1, \quad (9)$$

and therefore lie on a plane in r, g, b space which is an equilateral triangle as shown in FIG. 9a.

FIG. 9a also defines the grey point as W($W_r$, $W_g$, $W_b$), the point on the normalized color plane where red, green, and blue color components are equal. For this particular case:

$$W_r = 0.30, \quad (10)$$

$$W_g = 0.59, \text{ and} \quad (11)$$

$$W_b = 0.11 \quad (12)$$

These weighting factors are the NTSC luminance transmission primaries which compensate for perceived differences in brightness of the three primaries.

Figure 9B:
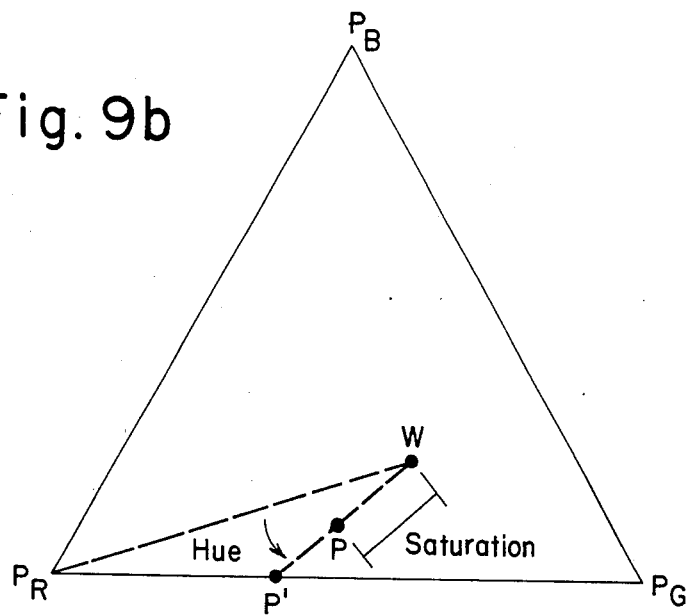

The hue and saturation of a normalized color P(r,g,b) is measured relative to the grey point. FIG. 9b illustrates that saturation (S) is defined as:

$$S = \frac{|WP|}{|WP'|}, \quad (13)$$

where P' defines the point of intersection of a line through W and P and the color triangle boundary. Hue (H) is defined as:

$$H = \angle P_r WP, \quad (14)$$

which is the angle defined by points $P_r$, W, and P.

Vector arithmetic can be performed to derive:

$$S = 1 - \frac{\text{Minimum}(R,G,B)}{I}, \quad (15)$$

and the algorithm for determining hue is:

$$\text{if } B \leq G \; H = \left[ \pi - \tan^{-1}\left(\frac{x}{\sqrt{(1-x)^2}}\right) \right]/2\pi \quad (16)$$

$$\text{else } H = \left[ \pi + \tan^{-1}\left(\frac{x}{\sqrt{(1-x)^2}}\right) \right]/2\pi, \quad (17)$$

where $X = d/(K_0 * K_1)$, (18)

$d = (1-W_r)(r-W_r) + (-W_g)(g-W_g) + (-W_b)(b-W_b)$, (19)

$K_0 = (r-W_r)^2 + (g-W_g)^2 + (b-W_b)^2$, and (20)

$K_1 = (1-W_r)^2 + (-W_g)^2 + (-W_b)^2$. (21)

Figure 9C:
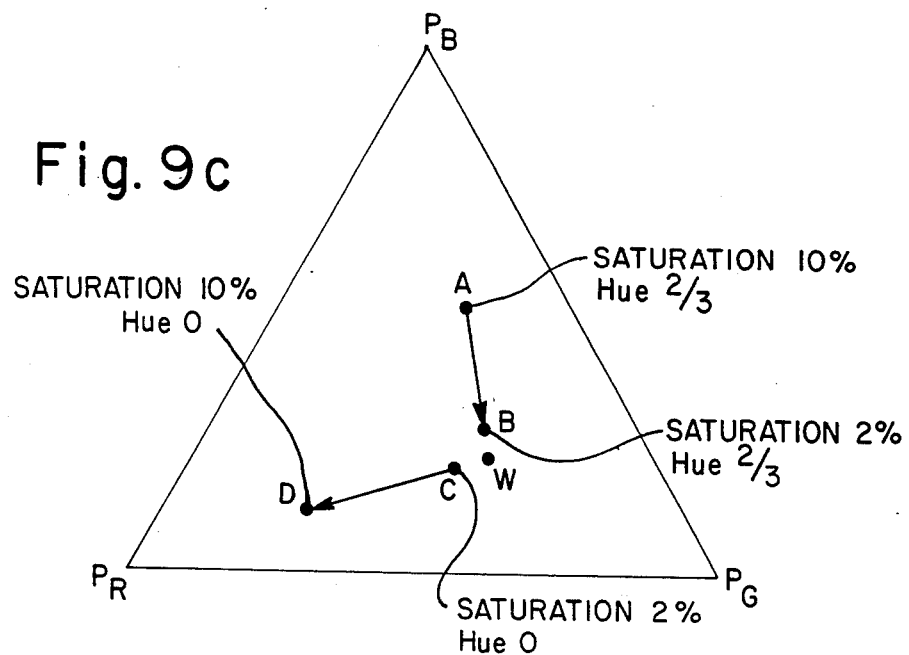

The inverse transforms from Hue-Saturation-Intensity (HSI) to Red, Green, and Blue (RGB) are shown in the flow chart of FIG. 10. The HSI to RGB color space transform is implemented by a computer program HSI-H2H.C (230 in FIG. 7), which is used to calculate the video look up table values. The normalized value of the intensity bits of the two parameter color pixels is the intensity function of HSI, and the hue/saturation bits are interpreted as a path on the color triangle from maximum saturation of hue 1 to minimum saturation of hue 1 and then from a minimum saturation of hue 2 to a maximum saturation of hue 2. This embodiment used maximum saturation values of 10%, minimum saturation values of 2%, hue 1 = ⅔ (Blue), hue 2 = 0 (red), and gamma exponent r = 1.5. The hue/saturation function is illustrated in FIG. 9c.

I claim:

1. A method for producing a magnetic resonance image for simultaneously visualizing independent first and second parameters in a field of data comprising the steps of:

modulating the intensity of pixels of an image in accordance with the value of said first parameter at a corresponding location in the field;

modulating the hue of said pixel to a first color when the value of said second parameter at the corresponding location in the field is greater than a reference value and modulating the hue of said pixel to a second color when said value of the second parameter is less than the reference value; and modulating the saturation of the color of the pixel in proportion to the absolute value of the deviation of the second parameter from the reference value at the corresponding location in the field;

wherein the first parameter is located magnetic resonance spin echo intensity and the second parameter is local magnetic resonance relaxation time.

2. The method of claim 1 wherein the second parameter is T1.

3. The method of claim 1 wherein the second parameter is T2.

4. The method of claim 1 wherein the second parameter is the difference between T1 AND T2.

5. The method of claim 1 wherein the second parameter is the mean of T1 and T2.

* * * * *